United States Patent [19]
Yamamori et al.

[11] Patent Number: 5,507,903
[45] Date of Patent: Apr. 16, 1996

[54] PROCESS FOR PRODUCING TWO-LAYERED TAPE FOR TAB

[75] Inventors: Yoshiyuki Yamamori, Yokohama; Shinichi Mikami, Yamato; Toshio Nakao, Yokohama; Takuya Tochimoto, Zushi; Etsu Takeuchi, Yokohama, all of Japan

[73] Assignee: Sumitomo Bakelite Company Limited, Tokyo, Japan

[21] Appl. No.: 949,543

[22] PCT Filed: Mar. 11, 1992

[86] PCT No.: PCT/JP92/00286

§ 371 Date: Jan. 12, 1994

§ 102(e) Date: Jan. 12, 1994

[87] PCT Pub. No.: WO92/16970

PCT Pub. Date: Oct. 1, 1992

[30] Foreign Application Priority Data

| | | | |
|---|---|---|---|
| Mar. 12, 1991 | [JP] | Japan | 3-125646 |
| Mar. 12, 1991 | [JP] | Japan | 3-125647 |
| May 15, 1991 | [JP] | Japan | 3-205009 |
| Sep. 19, 1991 | [JP] | Japan | 3-239721 |
| Sep. 19, 1991 | [JP] | Japan | 3-239723 |
| Sep. 26, 1991 | [JP] | Japan | 3-246401 |

[51] Int. Cl.⁶ .......................... B32B 31/04; B32B 31/18; B32B 31/26
[52] U.S. Cl. .......................... 156/229; 156/230; 156/231; 156/249; 156/253
[58] Field of Search .......................... 156/229, 230; 428/40, 349, 355, 473.3, 473.4, 474.7; 437/206; 427/96

[56] References Cited

U.S. PATENT DOCUMENTS

| | | | |
|---|---|---|---|
| 4,721,994 | 1/1988 | Mine | 357/70 X |
| 4,839,232 | 6/1989 | Morita et al. | 156/228 X |
| 4,857,143 | 8/1989 | Glenning | 156/668 X |
| 5,077,382 | 12/1991 | Meterko | 528/353 X |
| 5,122,617 | 6/1992 | Okada | 549/241 X |
| 5,166,308 | 11/1992 | Kreuz | 528/188 X |
| 5,175,240 | 12/1992 | Kreuz | 528/353 X |
| 5,196,500 | 3/1993 | Kreuz | 528/125 X |
| 5,219,977 | 6/1993 | Kreuz | 528/125 X |
| 5,224,264 | 7/1993 | Takahashi | 29/287 |
| 5,242,864 | 9/1993 | Fassberg | 437/228 X |
| 5,290,814 | 3/1994 | Narushima | 428/40 X |
| 5,298,304 | 3/1994 | Narushima | 428/40 X |

FOREIGN PATENT DOCUMENTS

| | | |
|---|---|---|
| 0036330 | 3/1981 | European Pat. Off. . |
| 0180220 | 10/1985 | European Pat. Off. . |
| 56-118421 | 9/1981 | Japan . |
| 016534 | 1/1986 | Japan . |
| 111182 | 5/1986 | Japan . |
| 61-245868 | 11/1986 | Japan . |
| 62-236732 | 10/1987 | Japan . |
| 63-021115 | 1/1988 | Japan . |
| 63-161023 | 7/1988 | Japan . |
| 1089389 | 4/1989 | Japan . |
| 1228833 | 9/1989 | Japan . |
| 2273984 | 11/1990 | Japan . |
| 3090348 | 4/1991 | Japan . |
| 3222444 | 10/1991 | Japan . |
| 222444 | 10/1991 | Japan . |
| 4004231 | 1/1992 | Japan . |
| 037692 | 7/1992 | Japan . |
| 5148458 | 6/1993 | Japan . |
| 6073349 | 3/1994 | Japan . |

*Primary Examiner*—David A. Simmons
*Assistant Examiner*—M. Curtis Mayes
*Attorney, Agent, or Firm*—Browdy and Neimark

[57] ABSTRACT

There are provided a process for producing a two-layered tape for TAB, which comprises forming desired holes in a semi-cured polyamic acid film formed on a release film or in a semi-cured polyamic acid film subjected to stretching of 10% or more, then pressure-bonding the resulting film or film laminate to a conductor foil or a conductor foil on which a semi-cured light-transmittable polyamic acid film is formed, so that the polyamic acid film and the conductor foil contact with each other or the two polyamic acid films contact with each other, conducting imidization, and thereafter forming a desired pattern in the conductor foil; a process for producing a stretched polyamic acid film by subjecting a polyamic acid film to stretching of 10% or more; and a process for producing a flexible base board for printed circuit or a flexible printed circuit board with a cover layer, both using said stretched polyamic acid film.

15 Claims, 3 Drawing Sheets

PROCESS FOR PRODUCING TWO-LAYERED TAPE FOR TAB

TECHNICAL FIELD

The present invention relates to a process for producing a tape for TAB (tape automated bonding), used for mounting semiconductor elements thereon, particularly to a process for producing a two-layered tape for TAB.

BACKGROUND ART

Semiconductor mounting techniques have accomplished remarkable progress in recent years. TAB, in particular, is under active development in order to respond to the current requirement for high-density mounting technique, because TAB enables formation of conductor pattern at a very high density, making it easy to connect multiple pins, and moreover TAB enables simultaneous bonding of all leads with semiconductor chips (gang bonding) without using any wire.

There are two kinds of tapes for TAB, i.e. a tape for TAB having a two-layered structure and a tape for TAB having a three-layered structure. The tape for TAB having a three-layered structure (hereinafter abbreviated as three-layered tape for TAB) is generally a laminate obtained by laminating a conductor foil (e.g., copper foil) with a heat-resistant resin film using an adhesive and has an adhesive layer of poor heat resistance; hence, the three-layered tape for TAB has been unable to fully exhibit the superior properties even when there is used, as the resin film, a polyimide film superior in properties such as heat resistance, chemical resistance and the like.

Meanwhile, the tape having a two-layered structure for TAB (hereinafter abbreviated as two-layered tape for TAB) generally has excellent heat resistance as a tape for TAB because the base film has no adhesive layer; however, the two-layered tape for TAB has found only very limited applications because of difficulty in production. That is, the two-layered tape for TAB is produced by two processes, i.e., the one process which comprises forming a conductor layer on a heat-resistant film made of a polyimide or the like by a thin-film-forming technique such as sputtering, vapor deposition, plating or the like, and then applying an etching treatment to the base film and the conductor layer to form desired holes (device holes, sprocket holes) and a desired conductor pattern, and the other process which comprises coating a varnish of a heat-resistant resin (e.g., polyimide) directly on a conductor foil (e.g., copper foil), drying the coated varnish to form a two-layered base board, and then applying an etching treatment to the resin layer and the conductor foil to form desired holes and a desired conductor pattern. In the former process, however, there is a problem that a rolled foil of excellent flexibility, a Fe—Ni alloy foil of excellent modulus, etc. cannot be used; moreover, the base film holes must be formed by an etching method, resulting in significantly reduced productivity as compared with the case employing the punching method applied to three-layered tapes for TAB. Meanwhile in the latter process, it is necessary that the linear thermal expansion of the resin used be nearly the same as that of the copper foil (conductor layer) in order to prevent formation of curls and wrinkles; however, such resins are generally rigid and have excellent solvent resistance, making it difficult to apply alkali etching in many cases and requiring use of dry etching (e.g. excimer laser) in order to form holes in the film layer, which results in disadvantageous productivity and cost.

Meanwhile, two-layered flexible materials for printed circuit, having no adhesive layer are finding increased applications, as electronic appliances become smaller and lighter. Similarly, film cover layers having no adhesive layer are in active development. Further, not only conventional flexible materials for wiring but also materials having a supporting film with holes, such as the above-mentioned carrier tape for TAB have found increased applications recently.

In the two-layered flexible base board for printed circuit, obtained by a process which comprises coating a polyamic acid on a conductor foil, followed by curing, there is no problem caused by an adhesive layer; however, the film properties are still inferior to those of ordinary stretched polyimide films.

Also in production of an adhesive layer-free cover layer for a two-layered flexible material for printed circuit, it has been attempted to use, for example, a process which comprises coating a polyimide precursor ink directly on a two-layered flexible material for printed circuit by a screen printing method or the like, followed by drying. In this process, however, use of a polyimide precursor varnish as an ink requires addition of a filler or the like for increased thixotropy, which makes it difficult to obtain balance between the filler-free polyimide film layer (base material) and the filler-containing polyimide cover layer. As a result, it has been impossible to obtain a flexible printed circuit board with a cover layer, having sufficient folding resistance.

Each of these conventional processes has drawbacks in heat resistance, adhesion strength, processability and chemical resistance. First, the adhesive layer-containing three-layered flexible material for printed circuit has a drawback that since the adhesive layer has low heat resistance, the heat resistance of the flexible material for printed circuit is determined by the heat resistance of the adhesive layer even when a polyimide is used as the supporting film. When a conductor layer is formed by vapor deposition or sputtering, there is a drawback in that the adhesion strength between the supporting film layer and the conductor layer is insufficient. In the case of casting method a polyamic acid is coated directly and then dried to form a thick film, and the stress due to the contraction caused by imidization is larger than the supporting strength of the conductor layer, producing large curls during drying. When a polyamic acid solution is directly coated on a conductor layer and dried a plurality of times, followed by imidization, the curls produced during these steps are reduced; however, since the film portion close to the conductor layer and the film portion distant from the conductor layer have different thermal histories, the imidization degree and residual solvent amount in film each differ depending upon the film portion, making large the curls, dimensional change, etc. of the film after etching of the copper foil. When there is used a laser, in particular, an excimer laser, excellent fine processing is obtained and damage to copper foil is small; however, there are problems that the strong imide bond must be cleaved, resulting in long processing time, low productivity and high running cost. Also, a polyimide having a molecular structure capable of being subjected to alkali etching after imidization has problems that it has somewhat low solvent resistance, that use of a strongly alkaline solution as an etching solution involves serious danger and that disposal of the waste solution is not easy.

An object of the present invention is to provide a process for producing a two-layered tape for TAB at high productivity without reducing heat resistance, alkali resistance, solvent resistance and electrical properties inherently possessed by two-layered tapes for TAB having no adhesive layer.

A further object of the present invention is to provide a process for producing a two-layered tape for TAB which is free from curls and which has good adhesion between the copper foil and the film.

Another object of the present invention is to provide a process for producing a two-layered tape for TAB which enables excellent registration and formation of fine lines and which enables high-density wiring.

A still further object of the present invention is to provide a process for producing a stretched polyamic acid film having a desired thickness and, optionally, holes, which film enables production of a two-layered flexible printed circuit board having no adhesive layer, which board has a polyimide layer having the same folding resistance, alkali resistance, solvent resistance, heat resistance, electrical properties and mechanical properties as possessed by ordinary stretched polyimide films (such a polyimide layer has been unobtainable by the conventional varnish casting process) and which board enables use of any conductor foil (e.g. rolled foil which cannot be used in the vapor deposition process).

A still further object of the present invention is to provide a flexible base board for printed circuit or a flexible printed circuit board with a cover layer film, both enabling high-density wiring and having very high heat resistance, by laminating a stretched polyimide film with desired holes to a conductor foil or a two-layered flexible base board with no adhesive layer and then conducting imidization to form, directly and using no adhesive, a polyimide insulation cover with holes without reducing the folding resistance, alkali resistance, solvent resistance, heat resistance, electrical properties and mechanical properties inherently possessed by polyimide films.

DISCLOSURE OF THE INVENTION

The present invention resides in a process for producing a two-layered tape for TAB, which is characterized by forming a semi-cured polyamic acid film on a release film, making desired holes (e.g. device holes) in the polyamic acid film, then pressure-bonding the two films to a conductor foil so that the polyamic acid film contacts with the foil, peeling off the release film, completing imidization, and thereafter forming a desired pattern in the conductor foil by an etching treatment or the like.

The present invention resides in a process for producing a two-layered tape for TAB whose supporting film layer has different thicknesses depending upon the portion and has a lower sub-layer made of a light-transmittable polyimide, which process is characterized by bonding, under heat and pressure, a semi-cured light-transmittable polyamic acid film formed on a conductor foil and a semi-cured polyamic acid film with desired holes, formed on a release film, so that the two polyamic acid films contact with each other, peeling off the release film, then completing imidization, and thereafter forming a desired pattern in the conductor foil.

The present invention resides in a process for producing a two-layered tape for TAB, which process is characterized by forming desired holes (e.g. device holes) in a semi-cured polyamic acid film subjected to stretching of 10% or more, then laminating the film to a conductor foil, completing imidization, and applying an etching treatment or the like to the conductor foil to form a desired pattern in the foil, as well as in a process for producing a two-layered tape for TAB wherein a desired conductor pattern is formed on a base film, which process is characterized by applying punching, cutting, alkali etching or laser processing to a stretched polyamic acid film to form desired holes (e.g. device holes), then pressure-bonding the film to a conductor foil (e.g. copper foil), subjecting the film and the foil to a heat treatment to complete imidization, thereafter filling the holes with a desired filler, then forming a desired resist pattern on the conductor foil, applying an etching treatment to form a conductor pattern, removing the-resist remaining on the conductor foil and the filler and applying punching to form sprocket holes.

The process for producing a semi-cured polyamic acid film subjected to stretching of 10% or more, according to the present invention comprises coating a polyamic acid solution on a release film or a release drum, drying the coated solution until it becomes tack-free, to form a polyamic acid film, then peeling off the polyamic acid film from the release film or the release drum, and subjecting the polyamic acid film alone to stretching of 10% or more at a particular temperature under a particular tension. The degree of curing differs depending upon the kind of the polyamic acid used; however, stretching of 10% or more generally gives improved film properties in tensile strength, modulus, etc. It is also possible to bring into a contiguous relation two polyamic acid films of same or different compositions so that the respective polyamic acid film sides face each other, or insert, if necessary, a desired number of polyamic acid films between the two films, simultaneously bond these two or more polyamic acid films under heat and pressure to obtain a thick polyamic acid film, and then subject the thick film to stretching.

In the present invention, the stretched polyamic acid film is bonded to a conductor foil under heat and pressure and then sufficiently imidized, whereby a two-layered flexible base board for printed circuit can be obtained.

The present invention resides in a semi-cured polyamic acid film subjected to stretching of 10% or more, having desired holes. By laminating this film to a conductor foil and then completing imidization, there can be obtained a flexible base board for printed circuit, having holes. Also by laminating the above film to a two-layered flexible printed circuit board having no adhesive layer and having a polyimide film layer alone and then completing imidization, there can be obtained a flexible printed circuit board with a cover layer film.

BRIEF DESCRIPTION OF DRAWINGS

In FIGS. 1(a) to 1(h), 1 to 8 refer to the followings.

1 . . . Polyester release film
2 . . . Polyamic acid film
3 . . . Device hole
4 . . . Copper foil
5 . . . Photoresist
6 . . . Polyimide film
7 . . . Sprocket hole
8 . . . Filler
In FIGS. 2(a) to 2(j), 1 to 7 and 1' to 2' refer to the followings.

Figure 1A:
FIG. 1(a) to 1(h) are sectional views showing steps in the present invention.

1 . . . Light-transmittable polyamic acid film 1

1'... Light-transmittable polyimide layer
2... Polyamic acid film 2
2'... Polyimide layer
3... Polyester release film
4... Device hole
5... Copper foil
6... Resist
7... Sprocket hole

DETAILED DESCRIPTION OF THE INVENTION

As the method for forming desired holes (e.g., device holes) in a polyamic acid film, there can be used punching, cutting, alkali etching, laser processing, etc. When a desired resist pattern is formed on a conductor foil and then an etching treatment is applied, it is necessary to fill the holes beforehand with a desired filler having, for example, the same composition as the resist to prevent etching from the holes. After a conductor pattern has been formed, the resist remaining on the conductor foil and the filler are removed, and sprocket holes are formed by punching.

As the method for forming a semi-cured polyamic acid film on a release film, there can be used a method which comprises coating a polyamic acid varnish directly on a release film and drying the coated varnish. Besides, there can be also used the following method if necessary. That is, there can be used a method which comprises bringing in a contiguous relation two polyamic acid films of same or different compositions, formed on respective release films so that the polyamic acid film sides face each other, or inserting, between them, a desired number of polyamic acid films, and simultaneously bonding these two or more polyamic acid films under heat and pressure to obtain a thick polyamic acid film.

That is, a polyamic acid solution is coated on a release film and is dried until it becomes tack-free, whereby a polyamic acid film is formed. The thus formed two polyamic acid films are brought in a contiguous relation so that the polyamic acid film sides face each other, and they are bonded under heat and pressure to obtain a polyamic acid film having a thickness of two times that of the film first obtained by coating and drying. In this case, it is possible to insert if necessary between the above two polyamic acid films, a desired number of polyamic acid films released from respective release films so that the polyamic acid film sides face each other, to obtain a thicker polyamic acid film. It is also possible to, after laminating, peel off one of the two release films and repeat the same procedure to obtain an even thicker polyamic acid film.

Then, the polyamic acid film formed on a release film is subjected to hole formation (holes are formed in the polyamic acid film and the release film or only in the polyamic acid film) by an ordinary method such as punching, cutting, alkali etching, laser or the like. Punching is preferred in view of the productivity and cost. After the hole formation is over, the polyamic acid film is bonded to a conductor foil under heat and pressure; the release film is peeled off; then imidization is conducted sufficiently.

In the present invention, appropriate conditions for drying the polyamic acid solution coated on a release film to form a semi-cured polyamic acid film, are 80°–200° C. and 5–30 minutes. When the drying temperature is lower than the above range and the drying time is shorter than the above range, the polyamic acid film has high fluidity in bonding it to a conductor foil under heat and pressure; there appear high degrees of spreading and oozing-out in and around the holes; the film thickness has a large variation; and the dimensional change after imidization is large. When the drying temperature is higher than the above range and the drying time is longer than the above range, the polyamic acid film has too low fluidity in bonding it to a conductor foil under heat and pressure; the peeling strength from the conductor foil is low; and many voids appear.

The desirable imidization degree of the polyamic acid film is 10–50%, preferably 20–40%. When the imidization degree is less than 10%, the polyamic acid film still has a certain degree of tackiness, making the workability low, and sticks to the back side of the release film after winding, making difficult separation of each polyamic acid film. When the imidization degree is more than 50%, the polyamic acid film has poor melt property and, when two such polyamic acid films are bonded under heat and pressure, it is impossible to obtain a sufficiently laminated film.

In coating a polyamic acid solution to form a polyamic acid film, appropriate thickness of the film is 50 μm or less in terms of thickness after imidization. When the thickness is larger than the above, the stress due to the contraction caused by imidization is larger than the supporting strength of the release film, generating large curls during drying; further, the large thickness reduces evaporation rate of the solvent, giving significantly low productivity.

When a light-transmittable polyamic acid is used, appropriate thickness of the light-transmittable polyamic acid coated on a conductor foil is 20 μm or less, preferably 3–10 μm in terms of thickness after imidization. When the thickness is larger than the above, the resulting film has low light transmittance, shows insufficient heat conduction during gang bonding, and exhibits low bonding property.

The appropriate conditions for bonding two polyamic acid films or a polyamic acid film and a conductor foil under heat and pressure, are 70°–200° C., 5–100 kg/cm$^2$ and 5–30 minutes when a press is used, and 70°–200° C., 1–500 kg/cm$^2$ and 0.1–50 m/min when a roll type laminator is used. With respect to the bonding temperature, in particular, a temperature 10°–30° C. lower than the drying temperature for the polyamic acid film is desirable because it generates no volatile material. The conditions for imidization may be those ordinarily employed in polyimide production.

Stretching of the polyamic acid film can be conducted using a known apparatus in the form of monoaxial stretching using a roll, simultaneous or successive biaxial stretching using a tenter, biaxial stretching using both a roll and a tenter, or the like. Simultaneous biaxial stretching is preferred in order to obtain similar dimensional stabilities in two directions of X and Y axes.

With respect to the conditions for stretching, stretching is conducted at a stretch ratio of 5–100%, preferably 10% or more, at a temperature of room temperature to 200° C., preferably 50°–170° C., a tension of 2–20,000 g/mm$^2$ and a stretch speed of 0.1–300%/min. When the stretching temperature is lower than room temperature, the molecular chain has a low freedom, making the orientation difficult. When the temperature is higher than 200° C., the polyamic acid film gives rise to excessive imidization and has low adhesion strength. When the stretch ratio is less than 5%, no stretching effect appears. When the stretch ratio is more than 100%, the polyamic acid film has low tear strength. It is possible to allow the polyamic acid film to swell using an organic solvent (e.g., dimethylacetamide) for easier stretching and then conduct stretching under a relaxed condition.

The polyamic acid solution in the present invention is a solution of a polyamic acid dissolved in an organic solvent, the polyamic acid being ordinarily obtained by reacting an acid anhydride with a diamine.

As the acid anhydride, there can be used, singly or in combination of two or more, various acid anhydrides such as trimellitic acid anhydride, pyromellitic acid anhydride, 3,3',4,4'-biphenyltetracarboxylic acid dianhydride, 2,3,3',4'-biphenyltetracarboxylic acid dianhydride, 3,3',4,4'-benzophenonetetracarboxylic acid dianhydride, 3,3'4 4'-p-terphenyltetracarboxylic acid dianhydride, 2,3,6,7-naphthalenetetracarboxylic acid dianhydride, 4,4'-hexafluoroisopropylidene-bis (phthalic anhydride) and the like.

As the diamine, there can be used, singly or in combination of two or more, various diamines such as p-phenylenediamine, 4,4'-diaminodiphenyl ether, 4,4'-diaminodiphenylsulfone, 4,4'-diaminodiphenylmethane, 3,3'-dimethylbenzidine, 4,4'-diamino-p-terphenyl, 4,4'-diamino-p-quaterphenyl,2,8-diaminodiphenylene oxide and the like.

The polyamic acid solution used in the present invention can be any as long as it has film formability and adhesive property to a metal foil. However, a polyamic acid solution as shown below meets intended purposes best. That is, it is a polyamic acid mixture solution obtained by mixing and stirring (A) a polyamic acid solution obtained by reacting 3,3',4,4'-biphenyl-tetracarboxylic acid dianhydride as an acid anhydride component with p-phenylenediamine as a diamine component and (B) a polyamic acid solution obtained by reacting pyromellitic acid dianhydride as an acid anhydride component with 4,4'-diaminodiphenyl ether as a diamine component, at a solid content ratio of A/B= 55/45 to 75/25. When the proportion of A is smaller than the above, the resulting polyamic acid film has curls. When the proportion of A is larger than the above, the resulting polyamic acid film is too rigid and has no flexibility, and shows reduced adhesion to a copper foil.

With respect to the monomers usable for obtaining a light-transmittable polyimide, the acid anhydride includes 2,2-bis(dicarboxyphenyl)hexafluoropropane dianhydride, oxydiphthalic anhydride, biphenyltetracarboxylic acid dianhydride, etc; and the diamine differs slightly depending upon the acid anhydride used in combination but includes m-substituted diamines containing a sulfone group, m-substituted diamines having an ether bond, diamines having a hexafluoropropylene group, etc. Preferably, the light-transmittable polyimide layer has a yellowness index (JIS K 7103) of 30 or less, desirably 20 or less.

The reaction between the acid anhydride component and the diamine component is preferably conducted at an acid anhydride component/diamine component molar ratio of 0.90 to 1.00. When the molar ratio is smaller than 0.90, no sufficiently high polymerization degree is obtained and the film after curing has poor properties. When the molar ratio is larger than 1.00, a gas is generated during curing, making it impossible to obtain a smooth film.

The reaction is ordinarily conducted in an organic polar solvent not reactive with the acid anhydride or the diamine. It is necessary that the organic polar solvent be inactive to the reaction system, be a solvent to a product obtained, and moreover be a good solvent to at least one of the reaction components, preferably both of them. Typical examples of such a solvent are N,N-dimethylformamide, N,N-dimethylacetamide, dimethylsulfone, dimethyl sulfoxide, N-methyl-2-pyrrolidone, etc. These solvents can be used singly or in combination. Besides, non-polar solvents such as benzene, dioxane, xylene, toluene, cyclohexane and the like can be used in combination with the organic polar solvent, as a dispersing agent for raw materials, a reaction-controlling agent, an agent for controlling evaporation from the product, a film-smoothening agent, etc.

Preferably, the reaction is conducted generally under water-free condition. It is because when water is present, there is a fear that the water gives rise to ring opening of the acid anhydride, makes the acid anhydride inactive and consequently stops the reaction. Therefore, it is necessary that the water in raw materials fed and the water in solvent be removed. Meanwhile, however, it is conducted in some cases to add water in order to control the progress of the reaction and thereby control the polymerization degree of the resin obtained. It is also preferable that the reaction be conducted in an inert gas atmosphere in order to prevent the oxidation of the diamine. As the inert gas, dry nitrogen gas is used generally.

The reaction temperature is desirably 0°–100° C. It is because when the reaction temperature is lower than 0° C. the reaction rate is low and, when the reaction temperature is higher than 100° C. there are initiated the ring-closing reaction and depolymerization reaction of the polyamic acid formed. The reaction is conducted ordinarily at about 20° C.

As a material usable as the release film, there can be cited plastic films made of polypropylene, polyester, polyethersulfone, polyimide, polyethylene or the like.

As a material usable as the conductor layer, there can be cited metal foils made of a single metal such as copper, aluminum, nickel or the like, and metal foils made of an alloy such as Fe—Ni alloy, Fe—Cr—Al alloy or the like.

A material usable as the two-layered flexible base board for printed circuit, having no adhesive layer and having a polyimide film layer alone, has no restriction as to the production process, and can be produced by casting, plating or the like as long as the material consists of a polyimide and a conductor metal foil and has no adhesive layer of ordinary acrylic type or epoxy type.

The present invention enables production of a two-layered tape for TAB having device holes and having excellent heat resistance, chemical resistance, etc., at high productivity. Further, the present invention has enabled production of a two-layered tape for TAB using a rolled foil (use of a rolled foil has been impossible in the vapor deposition process, etc.). Furthermore, the present invention enables production of a two-layered tape for TAB having no curl and having good adhesion strength between the copper foil and the film.

Meanwhile, in the two-layered tape for TAB obtained using a light-transmittable polyamic acid film, there occurs no confusion of a circuit pattern even when the circuit pattern is made fine, because an inner lead pattern is formed on the transparent polyimide film layer; it is easy to conduct registration from the back side (polyimide side) using a CCD camera or the like because the device hole portions are constituted by only the transparent polyimide layer having a smaller thickness; and gang bonding can be conducted easily at a high precision by applying a heat bar from the back side via the highly heat-resistant transparent polyimide layer.

According to the production process of the present invention, there can also be obtained, by using a stretched film, a flexible base board for printed circuit, a flexible base board for printed circuit provided with holes, or a flexible printed circuit board with a cover layer film, all having excellent properties, in the same steps as used conventionally, for example, continuous steps.

The present invention is easily applicable even to continuous steps and is suitable as an industrial process for producing a two-layered tape for TAB.

BEST MODE FOR CARRYING OUT THE INVENTION

(EXAMPLE 1)

FIGS. 1(a) to 1(h) show the steps employed in production of a two-layered tape for TAB according to the present invention.

Purified anhydrous 108 g of p-phenylenediamine and 200 g of 4,4'-diaminodiphenyl ether were charged in a four-necked separable flask equipped with a thermometer, a stirrer, a reflux condenser and a dry nitrogen gas inlet. Thereto was added a mixed solvent consisting of anhydrous 90% by weight of N-methyl-2-pyrrolidone and 10% by weight of toluene, in such an amount that the solid content in all the materials fed became 20% by weight, whereby the two materials charged first were dissolved in the mixed solvent. Dry nitrogen gas was flown during all the steps from preparatory step of the reaction to taking-out of the product. Then, purified anhydrous 294 g of 3,3',4,4'-biphenyltetracarboxylic acid dianhydride and 218 g of pyromellitic acid dianhydride were added in small proportions with stirring. Since the reaction was exothermic, the reaction system was cooled by circulating cold water of about 15° C. in an external water tank. After the addition, the internal temperature was set at 20° C. and stirring was conducted for 5 hours to complete the reaction, whereby a polyamic acid solution was obtained.

Figure 1B:
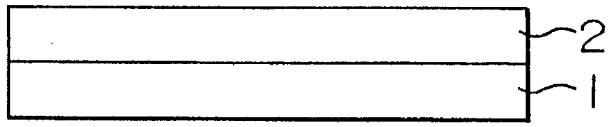
Figure 1C:
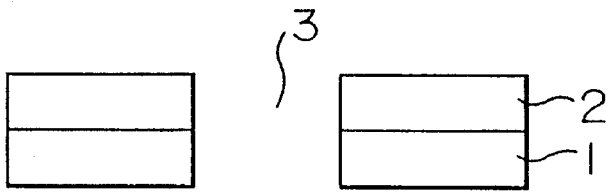
Figure 1D:
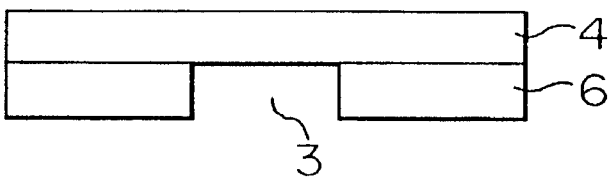
Figure 1E:
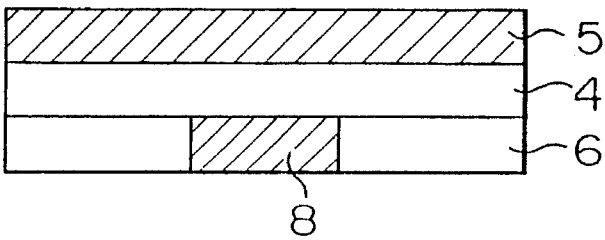
Figure 1F:
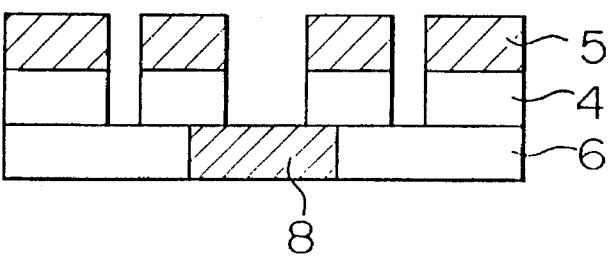
Figure 1G:
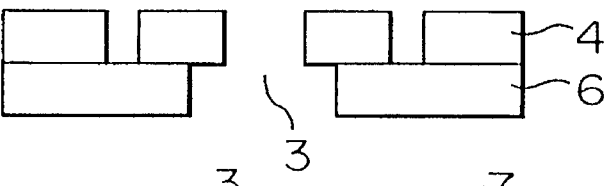
Figure 1H:
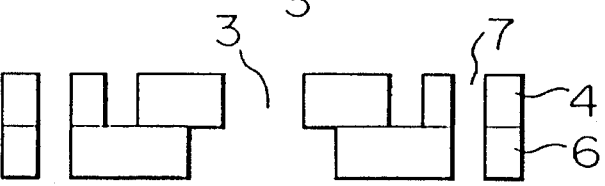

This polyamic acid solution was coated on a commercial release film 1 (a polyester film) using a roll coater so as to give a thickness after imidization, of 25 µm, followed by drying at 110° C. for 15 minutes, to obtain a polyamic acid film 2 with a release film (FIG. 1(b)). Device holes 3 were formed using a die (FIG. 1(c)). The side of the polyamic acid film was contacted with the roughened surface of a commercial copper foil 4, and bonding under heat and pressure was conducted at 90° C. and 40 kg/cm² for 15 minutes. Then, the release film 1 was peeled off and heating was conducted at 380° C. for 1 hour to complete imidization and form a polyimide film 6, whereby a two-layered base board with device holes (FIG. 1(d)) was obtained. Onto the conductor foil of the two-layered base board (FIG. 1(d)) were applied a desired resist pattern 5 and a desired filler 8 (FIG. 1(e)), and etching treatment was applied to form a conductor pattern (FIG. 1(f)). Then, the resist 5 remaining on the conductor foil and the filler 8 were removed (FIG. 1(g)). Punching was applied to form sprocket holes (7), whereby a two-layered tape for TAB was obtained (FIG. 1(h)).

(EXAMPLE 2)

Two same polyamic acid films each formed on a release film (these were the same as used in Example 1) were brought in a contiguous relation so that the polyamic acid film sides faced each other. They were bonded using a press under heat and pressure at 100° C. and 20 kg/cm² for 10 minutes to obtain a polyamic acid laminate film. Then, one of the release films was peeled off. Using this polyamic acid laminate film formed on a release film, the procedure of Example 1 was repeated to obtain a two-layered tape for TAB.

(EXAMPLE 3)

The same polyamic acid solution as used in Example 1 was coated on a commercial polyester film using a roll coater so as to give a thickness after imidization, of 25 µm, followed by drying at 110° C. for 15 minutes to obtain a polyamic acid film with a release film. Two of these films were brought in a contiguous relation so that the respective polyamic acid film sides faced each other, and bonded under heat and pressure using a roll type laminator at 90° C., 15 kg/cm² and 0.2 m/min. Then, holes were formed using a die. One of the release films was peeled off and the polyamic acid film side was contacted with the roughened surface of a commercial copper foil. They were bonded under heat and pressure using a press at 90° C. and 40 kg/cm² for 15 minutes. Then, the release film was peeled off and heating was conducted at 380° C. for 1 hour to complete imidization. The subsequent procedure was the same as in Example 1 to obtain a two-layered tape for TAB.

(EXAMPLE 4)

200 g of purified anhydrous 4,4'-diaminodiphenyl ether was charged in a four-necked separable flask equipped with a thermometer, a stirrer, a reflux condenser and a dry nitrogen gas inlet. Thereto was added a mixed solvent consisting of anhydrous 90% by weight of N-methyl-2-pyrrolidone and 10% by weight of toluene, in such an amount that the solid content in all the materials fed became 20% by weight, whereby the material charged first was dissolved in the mixed solvent. Dry nitrogen gas was flown during all the steps from preparatory step of the reaction to taking-out of the product. Then, 218 g of purified anhydrous pyromellitic acid dianhydride was added in small proportions with stirring. Since the reaction was exothermic, the reaction system was cooled by circulating cold water of about 15° C. in an external water tank. After the addition, the internal temperature was set at 20° C. and stirring was conducted for 5 hours to complete the reaction, whereby a polyamic acid solution was obtained.

This polyamic acid solution was coated on a commercial polyester film using a roll coater so as to give a thickness after imidization, of 25 µm, followed by drying at 110° C. for 10 minutes, to obtain a polyamic acid film with a release film (this polyamic acid film is referred to as film II). Then, the release film was peeled off and the film II was inserted between two polyamic acid films (films I) each with a release film, obtained in Example 1, so that the respective polyamic acid film sides of the films I faced each other. The three polyamic acid films were bonded under heat and pressure using a press at 100° C. and 25 kg/cm² for 15 minutes. Thereafter, holes were formed using a die and one of the two release films was peeled off. The polyamic acid film side was contacted with the roughened surface of a commercial copper foil. Bonding was conducted under heat and pressure using a press at 90° C. and 40 kg/cm² for 15 minutes. Lastly, the remaining release film was peeled off and heating was conducted at 380° C. for 1 hour to complete imidization. The subsequent procedure was carried out similarly to Example 1 to obtain a two-layered tape for TAB.

(EXAMPLE 5)

108 g of purified anhydrous p-phenylenediamine was charged in a four-necked separable flask equipped with a thermometer, a stirrer, a reflux condenser and a dry nitrogen gas inlet. Thereto was added a mixed solvent consisting of anhydrous 90% by weight of N-methyl-2-pyrrolidone and 10% by weight of toluene, in such an amount that the solid content in all the materials fed became 20% by weight, whereby the material charged first was dissolved in the mixed solvent. Dry nitrogen gas was flown during all the steps from preparatory step of the reaction to taking-out of the product. Then, 294 g of purified anhydrous 3,3',4,4'-biphenyltetracarboxylic acid dianhydride was added in small proportions with stirring. Since the reaction was exothermic, the reaction system was cooled by circulating cold water of about 15° C. in an external water tank. After the addition, the internal temperature was set at 20° C. and stirring was conducted for 5 hours to complete the reaction, whereby a polyamic acid solution (referred to as A) was obtained. Then, using the same apparatus and manner as in above, there were reacted 200 g of anhydrous 4,4'-diaminodiphenyl ether and 218 g of purified anhydrous pyromellitic acid dianhydride to obtain a polyamic acid solution (hereinafter referred to as B). A and B were mixed and stirred so as to give a solid content ratio of A/B=60/40.

Using the resulting polyamic acid solution and the same procedure as in Example 1, there was obtained a polyamic acid film. Then, a two-layered tape for TAB was obtained from the film.

(EXAMPLE 6)

Two same polyamic acid films both obtained in Example 5 were brought in a contiguous relation so that the respective polyamic acid film sides faced each other. They were bonded under heat and pressure using a press at 100° C. and 20 kg/cm² for 10 minutes to obtain a polyamic acid laminate film. Using this polyamic acid laminate film and the same manner as in Example 1, there was obtained a two-layered tape for TAB.

(EXAMPLE 7)

Using the same polyamic acid solution as in Example 5 and the same manner as in Example 3, there was obtained a two-layered tape for TAB.

(EXAMPLE 8)

Using the same apparatus and manner as in Example 5, there were synthesized a solution (referred to as A) of a polyamic acid consisting of p-phenylenediamine and 3,3',4,4'-biphenyltetracarboxylic acid dianhydride and a solution (referred to as B) of a polyamic acid consisting of 4,4'-diaminodiphenyl ether and pyromellitic acid dianhydride. A and B were mixed and stirred so as to give a solid content ratio of A/B=70/30. Using the resulting polyamic acid solution and the same manner as in Example 4, there was obtained a two-layered tape for TAB.

(EXAMPLE 9)

Using the same apparatus and manner as in Example 5, there were synthesized a solution (referred to as A) of a polyamic acid consisting of p-phenylenediamine and 3,3',4 4'-biphenyltetracarboxylic acid dianhydride and a solution (referred to as B) of a polyamic acid consisting of 4,4'-diaminodiphenyl ether and pyromellitic acid dianhydride. A and B were mixed and stirred so as to give a solid content ratio of A/B=80/20. The subsequent procedure was carried out similarly to Example 1, whereby a two-layered tape for TAB was obtained.

The evaluation results for the two-layered tapes for TAB produced in Examples 5 to 9 are shown in Table 1.

TABLE 1

| | Example | | | | |
|---|---|---|---|---|---|
| | 5 | 6 | 7 | 8 | 9 |
| Appearance (curls) | ⊙ | ⊙ | ⊙ | ⊙ | ○ |
| Chemical resistance*¹ | ⊙ | ⊙ | ⊙ | ⊙ | ⊙ |
| Adhesion strength*² | ⊙ | ⊙ | ⊙ | ⊙ | Δ |
| Soldering resistance*³ | ⊙ | ⊙ | ⊙ | ⊙ | ⊙ |
| Overall evaluation | ⊙ | ⊙ | ⊙ | ⊙ | Δ |

Notes
*¹Treated with $CH_2Cl_2$
*²Adhesion strength between copper foil and polyimide layer
*³300° C./3 min
⊙ Excellent
○ Good
Δ Acceptable (EXAMPLE 10)

FIG. 2(a) to 2(j) show steps for producing a two-layered tape for TAB, using a light-transmittable polyamic acid film.

One mole of 3,3'-diaminodiphenylsulfone was charged in a four-necked separable flask equipped with a thermometer, a stirrer, a reflux condenser and a dry nitrogen gas inlet. Thereto was added a mixed solvent consisting of anhydrous 90% by weight of N-methyl-2-pyrrolidone and 10% by weight of toluene, in such an amount that the solid content in all the materials fed became 20% by weight, whereby the material added first was dissolved in the mixed solvent. Dry nitrogen gas was flown during all the steps from preparatory step of the reaction to taking-out of the product. Then, 1 mole of purified anhydrous 3,3',4 4'-biphenyltetracarboxylic acid dianhydride was added in small proportions with stirring. Since the reaction was exothermic, cold water of about 15° C. was circulated in an external water tank to cool the reaction system. After the addition, the internal temperature was set at 20° C., followed by stirring for 5 hours to complete the reaction, whereby a polyamic acid solution (A) was obtained.

In the same apparatus and manner, purified anhydrous 1 mole of p-phenylenediamine and 1 mole of 4,4'-diaminophenyl ether were charged. Thereto was added a mixed solvent consisting of anhydrous 90% by weight of N-methyl-2-pyrrolidone and 10% by weight of toluene, in such an amount that the solid content in all the materials fed became 20% by weight, whereby the two materials charged first were dissolved in the mixed solvent. Dry nitrogen gas was flown during all the steps from preparatory step of the reaction to taking-out of the product. Then, purified anhydrous 1 mole of 3,3',4,4'-biphenyltetracarboxylic acid dianhydride and 1 mole of pyromellitic acid dianhydride were added in small proportions with stirring. Since the reaction was exothermic, cold water of about 15° C. was circulated in an external water tank to cool the reaction system. After the addition, the internal temperature was set at 20° C., followed by stirring for 5 hours to complete the reaction, whereby a polyamic acid solution (B) was obtained.

Figure 2A:
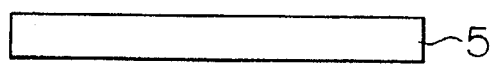
FIGS. 2(a) to 2(j) are sectional views showing steps in the present invention using a light-transmittable polyamic acid film.
Figure 2B:
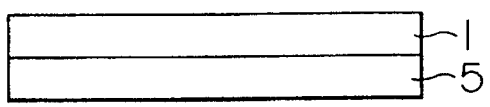
Figure 2C:
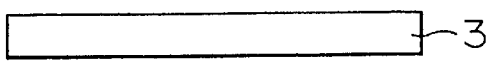
Figure 2D:
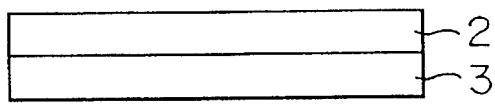
Figure 2E:
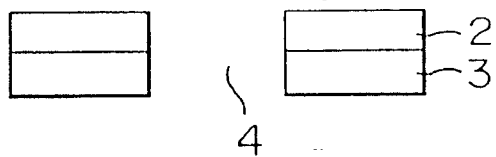
Figure 2F:
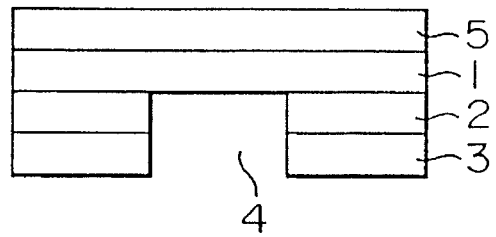

The polyamic acid solution (A) was coated on a rolled copper foil 5 of 35 μm using a roll coater so as to give a thickness after imidization, of 10 μm, followed by drying at 110° C. for 10 minutes, whereby a light-transmittable polyamic acid film 1 with a copper foil 5 (FIG. 2(b)) was obtained. Then, the polyamic acid solution (B) was coated on a commercial polyester release film 3 using a roll coater so as to give a thickness after imidization, of 25 μm, followed by drying at 110° C. for 15 minutes, whereby a polyamic acid film 2 with a release film 3 (FIG. 2(d)) was obtained. Holes were formed using a die in the polyamic acid film 2 with a release film (FIG. 2(d)) at the portions corresponding to device holes 4, etc. (FIG. 2(e)). The light-transmittable polyamic acid film 1 with a copper foil (FIG. 2(b)) and the polyamic acid film 2 with a release film having holes were brought in a contiguous relation so that the two polyamic acid film sides faced each other, and bonding under heat and pressure was conducted at 90° C. and 40 kg/cm$^2$ for 15 minutes (FIG. 2(f)). Thereafter, the release film 3 was peeled off, and heating was conducted at 380° C. for 1 hour to complete imidization to obtain a two-layered base board (FIG. 2(g)) having a polyimide layer 2' and a light-transmittable polyimide layer 1' and having holes corresponding to device holes 4, etc.

Figure 2G:
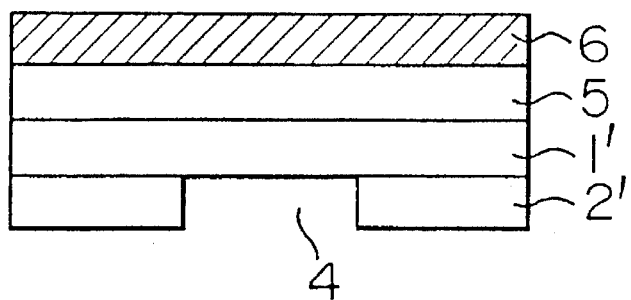
Figure 2H:
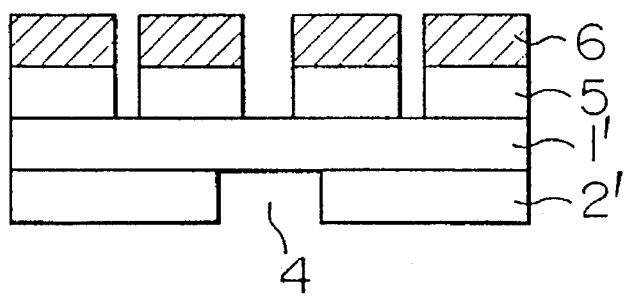
Figure 2I:
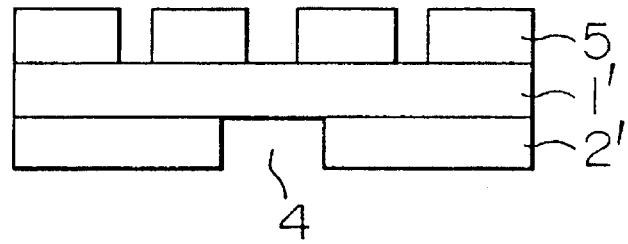
Figure 2J:
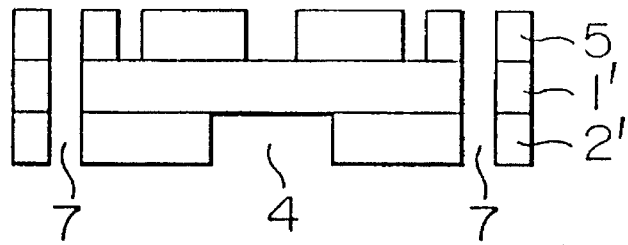

A desired resist 6 was applied onto the conductor foil of the two-layered base board (FIG. 2(g)). Then, light exposure and development were conducted to form a conductor pattern (FIG. 2(h)). Then, the resist 6 remaining on the conductor foil was removed (FIG. 2(i)), and sprocket holes 7 were formed by punching, to obtain a two-layered tape for TAB (FIG. 2(j)).

(EXAMPLE 11)

Two same polyamic acid films 2 each with a release film, obtained in Example 10 were brought in a contiguous relation so that the respective polyamic acid film sides faced each other, and then were bonded under heat and pressure using a press at 100° C. and 20 kg/cm$^2$ for 10 minutes to obtain a polyamic acid laminate film. Using it as a polyamic acid film (FIG. 2(d) and in the same manner as in Example 10, there was obtained a two-layered tape for TAB.

(EXAMPLE 12)

The same polyamic acid solution (B) as obtained in Example 10 was coated on a commercial polyester film using a roll coater so as to give a thickness after imidization, of 25 μm, followed by drying at 110° C. for 15 minutes, to obtain a polyamic acid film with a release film. Two of these films were brought in a contiguous relation so that the respective polyamic acid film sides faced each other, and bonding under heat and pressure was conducted using a roll type laminator at 90° C., 15 kg/cm$^2$ and 0.2 m/min. Then, holes were formed using a die. One of the release films were peeled off. The resulting laminate and the same polyamic acid film (with a copper foil) as used in Example 1 was brought in a contiguous relation so that the respective polyamic acid film sides faced each other. Then, bonding was conducted under heat and pressure using a press at 90° C. and 40 kg/cm$^2$ for 15 minutes. Thereafter, the release film was peeled off and heating was conducted at 380° C. for 1 hour to complete imidization. The subsequent procedure was carried out similarly to Example 10, whereby a two-layered tape for TAB was obtained.

(EXAMPLE 13)

One mole of 1,3-bis(3-aminophenoxy)benzene was charged in a four-necked separable flask equipped with a thermometer, a stirrer, a reflux condenser and a dry nitrogen gas inlet. Thereto was added a mixed solvent consisting of anhydrous 90% by weight of N-methyl-2-pyrrolidone and 10% by weight of toluene, in such an amount that the solid content in all the materials fed became 20% by weight, whereby the material added first was dissolved in the mixed solvent. Dry nitrogen gas was flown during all the steps from preparatory step of the reaction to taking-out of the product. Then, 1 mole of purified anhydrous 3,3',4,4'-biphenyltetracarboxylic acid dianhydride was added in small proportions with stirring. Since the reaction was exothermic, cold water of about 15° C. was circulated in an external water tank to cool the reaction system. After the addition, the internal temperature was set at 20° C., followed by stirring for 5 hours to complete the reaction, whereby a polyamic acid solution (C) was obtained.

In the same apparatus and manner, 1 mole of purified anhydrous p-phenylenediamine was charged. Thereto was added a mixed solvent consisting of anhydrous 90% by weight of N-methyl-2-pyrrolidone and 10% by weight of toluene, in such an amount that the solid content in all the materials fed became 20% by weight, whereby the material charged first was dissolved in the mixed solvent. Dry nitrogen gas was flown during all the steps from preparatory step of the reaction to taking-out of the product. Then, 1 mole of purified anhydrous 3,3',4 4'-biphenyltetracarboxylic acid dianhydride was added in small proportions with stirring. Since the reaction was exothermic, cold water of about 15° C. was circulated in an external water tank to cool the reaction system. After the addition, the internal temperature was set at 20° C. followed by stirring for 5 hours to complete the reaction, whereby a polyamic acid solution (D) was obtained. A two-layered tape for TAB was obtained in the same manner as in Example 10 except that the polyamic acid solution (C) was used in place of the polyamic acid solution (A) and that the polyamic acid solution (D) was used in place of the polyamic acid solution (B).

(EXAMPLE 14)

A polyamic acid solution obtained in the same manner as in Example 1 was coated on a stainless steel drum using a bar coater so as to give a thickness after imidization, of 50 μm, followed by drying at 110° C. for 15 minutes. The resulting film was peeled off from the drum and subjected to 40% simultaneous biaxial stretching at 110° C. at a rate of 18%/min with a tension of 2 kg/cm (4,000 g/mm$^2$) being applied, to obtain a polyamic acid film. Device holes were formed in this film using a die. Then, the film was placed on the roughened surface of a commercial copper foil, and bonding under heat and pressure was conducted at 90° C. and 40 kg/cm$^2$ for 15 minutes. Thereafter, heating was conducted at 380° C. for 1 hour to complete imidization to obtain a two-layered base board with device holes.

Onto the conductor foil of the two-layered base board was applied a desired resist pattern, and hole-filling treatment, followed by etching was carried out to form a conductor pattern. Then, the resist remaining on the conductor foil and the filler were removed, and punching was applied to form sprocket holes, whereby a two-layered tape for TAB was obtained.

(EXAMPLE 15)

A two-layered tape for TAB was obtained in the same manner as in Example 14 except that 10% stretching was conducted under the stretching conditions of 150° C., 0.5 kg/cm (1,000 g/mm$^2$) and 1%/min. Incidentally, the film had a linear expansion coefficient of $8.5 \times 10^{-6}$/°C.

(EXAMPLE 16)

Two same stretched polyamic acid films obtained in the same manner as in Example 14 were brought in a contiguous relation and bonded under heat and pressure using a press at 100° C. and 20 kg/cm² for 10 minutes to obtain a polyamic acid laminate film. This polyamic acid laminate film was subjected to the same procedure as in Example 14 to obtain a two-layered tape for TAB.

(EXAMPLE 17)

A polyamic acid solution obtained in the same manner as in Example 1 was coated on a commercial polyester film using a roll coater so as to give a thickness after imidization, of 75 μm, followed by drying at 110° C. for 15 minutes to obtain a polyamic acid film with a release film. Two of these films were brought in a contiguous relation so that the respective polyamic acid film sides faced each other, and bonded under heat and pressure using a roll type laminator at 90° C., 15 kg/cm² and 0.2 m/min. Then, the release films were peeled off and the resulting film was subjected to 40% simultaneous biaxial stretching at 120° C. at a rate of 18%/min with a tension of 3 kg/cm (4,000 g/mm²) being applied, whereby a polyamic acid film was obtained. Holes were formed in this film using a die. The resulting film was placed on the roughened surface of a commercial copper foil, and they were bonded under heat and pressure using a press at 90° C. and 40 kg/cm² for 15 minutes. Then, heating was conducted at 380° C. for 1 hour to complete imidization. The subsequent procedure was carried out similarly to Example 14 to obtain a two-layered tape for TAB.

(EXAMPLE 18)

A polyamic acid solution obtained in the same manner as in Example 1 was coated on a stainless steel drum using a die coater so as to give a thickness after imidization, of 50 μm, followed by drying at 110° C. for 15 minutes. The resulting film was peeled off from the drum and subjected to 40% simultaneous biaxial stretching at 110° C. at a rate of 18%/min with a tension of 2 kg/cm (4,000 g/mm²) being applied, to obtain a polyamic acid film. Then, the polyamic acid film was placed on the roughened surface of a commercial copper foil, and bonding under heat and pressure was conducted at 90° C. and 40 kg/cm² for 15 minutes. Thereafter, heating was conducted at 380° C. for 1 hour to complete imidization.

The resulting two-layered flexible base board for printed circuit had properties at least equal to those of a base board obtained by an ordinary process, i.e. direct coating on a copper foil, drying and imidization.

(EXAMPLE 19)

A polyamic acid solution obtained in the same manner as in Example 1 was coated on a commercial polyester film using a roll coater so as to give a thickness after imidization, of 25 μm, followed by drying at 110° C. for 15 minutes to obtain a polyamic acid film with a release film. Two of these films were brought in a contiguous relation so that the respective polyamic acid film sides faced each other, and bonded under heat and pressure using a roll type laminator at 90° C., 15 kg/cm² and 0.2 m/min. Then, the release films were peeled off and the resulting film was subjected to 30% simultaneous biaxial stretching at 130° C. at a rate of 18%/min with a tension of 2 kg/cm (4,000 g/mm²) being applied, whereby a polyamic acid film was obtained. The polyamic acid film was placed on the roughened surface of a commercial copper foil, and they were bonded under heat and pressure using a press at 90° C. and 40 kg/cm² for 15 minutes. Then, heating was conducted at 380° C. for 1 hour to complete imidization to obtain a two-layered flexible base board for printed circuit.

(EXAMPLE 20)

A polyamic acid solution obtained in the same manner as in Example 1 was coated on a stainless steel drum using a bar coater so as to give a thickness after imidization, of 25 μm, followed by drying at 110° C. for 15 minutes. The resulting film was peeled off from the drum and subjected to 40% simultaneous biaxial stretching at 110° C. with a tension of 1 kg/cm (4,000 g/mm²) being applied, whereby a polyamic acid film was obtained. Holes were formed in the film using a die. The resulting film was placed on the roughened surface of a commercial copper foil as well as on a two-layered flexible base board for printed circuit (A-1 FLEX manufactured by Sumitomo Bakelite Co., Ltd.). Each laminate was subjected to bonding under heat and pressure at 90° C. and 40 kg/cm² for 15 minutes. Then, heating was conducted at 380° C. for 1 hour to complete imidization.

Each of the thus obtained test pieces was examined for peel strength against copper foil, soldering heat resistance and amount of oozing-out at surface connection portions of copper foil.

Peel strength against copper foil and soldering heat resistance were measured in accordance with JIS C 5016. The peel strength was 1.1 kg/cm and good. The soldering heat resistance showed no abnormality at 300° C. With respect to amount of oozing-out, reduction in 5-mm diameter of surface connection holes was examined. As a result, there was no oozing-out.

With respect to folding resistance, there was measured the number of folding times until the copper foil was cut when the test piece was subjected to the MIT folding resistance test (0.8 R). As a result, the folding resistance was 5,000 times.

POSSIBILITY OF APPLICATION IN INDUSTRY

The tape for TAB according to the present invention can be used as a method for very high density mounting of semiconductors in production of semiconductor-mounted flexible printed circuit boards used in cameras, liquid crystal display devices, etc.

Further, the stretched polyamic acid film according to the present invention can be used for a flexible base board for printed circuit having good dimensional stability, or for a flexible printed circuit board with a cover layer film.

We claim:

1. A process for producing a flexible base board for printed circuit which is characterized by pressure-bonding a stretched polyamic acid film to a conductor foil wherein said stretched polyamic acid film is prepared by coating a polyamic acid solution on a release film or a release drum, drying the coated solution until it becomes tack-free to form a polyamic acid film, then peeling off the polyamic acid film from the release film or the release drum and subjecting the polyamic acid film to stretching of 10% or more; and then completing imidization.

2. A process for producing a two-layered tape for TAB, which is characterized by forming desired holes in a semi-cured polyamic acid film subjected to stretching of 10% or more, then laminating the film to a conductor foil, completing imidization, and thereafter forming a desired pattern in the conductor foil.

3. A process for producing a two-layered tape for TAB according to claim 2, wherein the polyamic acid film subjected to stretching is formed by use of a varnish obtained by mixing (A) a polyamic acid solution obtained by reacting 3,3',4,4'-biphenyltetracarboxylic acid dianhydride and p-phenylenediamine with (B) a polyamic acid solution obtained by reacting pyromellitic acid dianhydride with 4,4'-diaminodiphenyl ether, at a solid content ratio of A/B= 55/45 to 75/25.

4. A process for producing a two-layered tape for TAB according to claim 3, which is characterized by, after the completion of imidization, filling the holes with a desired filler and, after pattern formation, removing the filler.

5. A process for producing a two-layered tape for TAB according to claim 2, which is characterized by, after the completion of imidization, filling the holes with a desired filler and, after pattern formation, removing the filler.

6. A process for producing a two-layered tape for TAB, which is characterized by forming desired holes in a semi-cured polyamic acid film formed on a release film, then laminating the polyamic acid film having said holes and the release film to a conductor foil so that the polyamic acid film having said holes is brought in contact with the conductor foil, peeling off the release film, completing imidization, and forming a desired pattern in the conductor foil.

7. A process for producing a two-layered tape for TAB according to claim 6, wherein the polyamic acid film is formed by use of a varnish obtained by mixing (A) a polyamic acid solution obtained by reacting 3,3',4,4'-biphenyltetracarboxylic acid dianhydride and p-phenylenediamine with (B) a polyamic acid solution obtained by reacting pyromellitic acid dianhydride with 4,4'-diaminodiphenyl ether, at a solid content ratio of A/B=55/45 to 75/25.

8. A process for producing a two-layered tape for TAB according to claim 7, which is characterized by, after the completion of imidization, filling the holes with a desired filler and, after pattern formation, removing the filler.

9. A process for producing a two-layered tape for TAB according to claim 6, which is characterized by, after the completion of imidization, filling the holes with a desired filler and, after pattern formation, removing the filler.

10. A process for producing a flexible printed circuit board with a cover layer film, comprising the steps of forming desired holes in a stretched polyamic acid film, which is prepared by coating a polyamic acid solution on a release film or a release drum, drying the coated solution until it becomes tack-free to form a polyamic acid film, then peeling off the polyamic acid film from the release film or the release drum, and subjecting the polyamic acid film to stretching of 10% or more, to prepare a cover layer film; pressure-bonding the cover layer film to a two-layered flexible printed circuit board having no adhesive layer, one of the layers being a polyimide layer; and then completing imidization.

11. A process for producing a semi-cured stretched polyamic acid film, which is characterized by bringing in a contiguous relation two or more polyamic acid films of same or different compositions so that they face each other, simultaneously bonding them under heat and pressure to obtain a thick polyamic acid film, and then subjecting the polyamic acid film to stretching of 10% or more.

12. A process for producing a flexible base board for printed circuit, which is characterized by pressure-bonding a stretched polyamic acid film obtained in claim 11, to a conductor foil and then completing imidization.

13. A process for producing a flexible printed circuit board with a cover layer film, which is characterized by forming desired holes in a stretched polyamic acid film obtained in claim 11 to prepare a cover layer film; pressure-bonding the cover layer film to a two-layered flexible printed circuit board having no adhesive layer, one of the layers being a polyimide layer; and then completing imidization.

14. A process for producing a two-layered tape for TAB whose supporting film layer has different thicknesses depending upon the portions and has a lower sub-layer made of a light-transmittable polyimide having a yellowness index of 30 or less, which process is characterized by bonding, under heat and pressure, a semi-cured light-transmittable polyamic acid film having a yellowness index of 30 or less formed on a conductor foil and a semi-cured polyamic acid film with desired holes formed on a release film so that the two polyamic acid films contact with each other, peeling off the release film, then completing imidization, and thereafter forming a desired pattern in the conductor foil.

15. A process for producing a two-layered tape for TAB whose supporting film layer has different thicknesses depending upon the portions and has a lower sub-layer made of a light-transmittable polyimide, which process is characterized by bonding, under heat and pressure, a semi-cured light-transmittable polyamic acid film formed on a conductor foil and a semi-cured polyamic acid film with desired holes formed on a release film so that the two polyamic acid films contact with each other, peeling off the release film, then completing imidization, and thereafter forming a desired pattern in the conductor foil;

the polyamic acid film with holes being formed by use of a varnish obtained by mixing (A) a polyamic acid solution obtained by reacting 3,3',4,4'-biphenyltetracarboxylic acid dianhydride and p-phenylenediamine with (B) a polyamic acid solution obtained by reacting pyromellitic acid dianhydride with 4,4'-diaminodiphenyl ether, at a solid content ratio of A/B=55/45 to 75/25.

* * * * *